(12) United States Patent
Sueyoshi

(10) Patent No.: US 6,566,257 B2
(45) Date of Patent: May 20, 2003

(54) METHOD FOR PRODUCING SEMICONDUCTOR DEVICE

(75) Inventor: Yasuhiko Sueyoshi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/811,552

(22) Filed: Mar. 20, 2001

(65) Prior Publication Data

US 2001/0034101 A1 Oct. 25, 2001

(30) Foreign Application Priority Data

Apr. 25, 2000 (JP) ............................ 2000-124311

(51) Int. Cl.⁷ .............................................. H01L 21/44
(52) U.S. Cl. ....................................... 438/682; 438/655
(58) Field of Search ................................ 438/682, 582, 438/583, 655

(56) References Cited

U.S. PATENT DOCUMENTS

| 5,134,301 | A | * | 7/1992 | Kamata et al. | ......... 250/492.2 |
| 5,216,253 | A | | 6/1993 | Koike | |
| 5,857,889 | A | | 1/1999 | Abbott | |
| 6,239,440 | B1 | * | 5/2001 | Abbott | ................. 250/423 R |
| 6,281,556 | B1 | * | 8/2001 | Gerritsen et al. | ........... 257/382 |

FOREIGN PATENT DOCUMENTS

| EP | 0 964 426 | 12/1999 |
| JP | 6-132243 | 5/1994 |

OTHER PUBLICATIONS

"Tungsten Contamination in BF₂ Implants", Liebert et al., XP 10220578, Jun. 1996, pp. 135–138.
"Effect of BF₂ Induced Mo⁺⁺ on Long Retention Time in 0.25 μm DRAM Technology", Curello et al., pp. 550–553.
"High Density Plasma Flood System for Wafer Charge Neutralisation", Ito et al., pp. 478–481.

* cited by examiner

Primary Examiner—John F. Niebling
Assistant Examiner—Christopher Lattin
(74) Attorney, Agent, or Firm—Nixon & Vanderhye P.C.

(57) ABSTRACT

A semiconductor device is produced by forming a gate electrode on a semiconductor substrate, and by then forming source/drain regions by an ion implantation using the gate electrode as a mask. A suicide film is formed on at least the surface of the gate electrode. In one aspect of the invention, the ion implantation is performed by controlling a tungsten dose in a range from 0 to $5\times10^9$ atom/cm². In another aspect of the invention, the ion implantation is performed by controlling tungsten concentration in the gate electrode ion to fall in a range from 0 to $3\times10^{14}$ atom/cm³.

6 Claims, 7 Drawing Sheets

METHOD FOR PRODUCING SEMICONDUCTOR DEVICE

CROSS-REFERENCES TO RELATED APPLICATION

This application is related to Japanese Patent Application No. 2000-124311, filed on Apr. 25, 2000 whose priority is claimed under 35 USC §119, the disclosures of which are incorporated by reference in their entirety.

BACKGROUND OF THE INVENTION

1. Field of the Invention

The present invention relates to a method for producing a semiconductor device, and in further detail, it relates to a method for producing a semiconductor device comprising a gate electrode having a metallic silicide layer formed on the surface thereof.

2. Prior Art

In producing MOS transistors, gate electrodes and source/drain regions with low resistance have been implemented heretofore by employing a method comprising forming silicide films on the surface thereof (see, for instance, an unexamined published Japanese patent application Hei6 (1994)-132243).

In general, silicide is formed on the surface of the gate electrode and source/drain regions in accordance with the following procedure.

Referring first to FIG. 7(a), a silicon oxide film and a polysilicon film are formed on an N well 33 formed on a silicon substrate 31 having an device isolation region 32 provided thereon, and after patterning the silicon oxide film and the polysilicon film as desired, a gate oxide film 34 and a gate electrode 35 are formed. A side wall spacer 36 is formed on the side wall of the gate electrode 35 thereafter.

Then, as shown in FIG. 7(b), the surface of the silicon substrate 31 is subjected to ion implantation of boron difluoride 37 by using the gate electrode 35 and the side wall spacer 36 as masks. Then, the source/drain regions 38 are formed by applying thermal treatment thereto. By the ion implantation, boron difluoride 37 is implanted to the gate electrode 35, at the same time, contaminants such as tungsten, etc., derived from members constituting the ion implantation apparatus, are incorporated into the gate electrode 35 and the source/drain regions 38.

Referring to FIG. 7(c), the contaminants 40 remaining on the upper surface of the gate electrode 35 and on the source/drain regions 38 that are not covered by the side wall spacer 36 are volatilized by heating with a lamp in an inert gas.

Then, the silicon of the gate electrode 35 and the source/drain regions 38 is exposed by removing the naturally oxidized film 39 on the surface of the gate electrode 35 and the source/drain regions 38 by using argon ion sputtering.

Subsequently, as shown in FIG. 7(d), a titanium film 41 is vapor deposited on the entire surface of the silicon substrate 31. Then referring to FIG. 7(e), titanium is reacted with silicon by heating, and after removing the titanium film 41 remaining unreacted, a titanium silicide film 42 is formed on the surface of the gate electrode 35 and the source/drain regions 38.

In the case where a MOS transistor is produced by forming the titanium silicide film 42 in accordance with the method above, however, the MOS transistor sometimes suffers an extremely low reliability ascribed to the deterioration of the gate oxide film 34.

This is attributed to the fact that the contaminants such as tungsten, etc., that are incorporated during the ion implantation in forming the gate electrode and the source/drain regions induce an excessive reaction inside the gate electrode and the source/drain regions by the heat treatment for forming the silicide film.

More specifically, ion implantation is generally performed by using an ion implantation apparatus comprising an ion source comprised an arc chamber and a filament which are made of tungsten. Tungsten from the ion source generates divalent tungsten fluoride ions during the implantation of boron difluoride ions. These divalent ions undergo change in charge after passing through the draw out electrode to form trivalent ions before entering the magnet of mass analyzer. Thus are formed tungsten monofluoride ions ($WF^{+++}$, having a mass number of 44.2 to 45.6), tungsten difluoride ions ($WF_2^{+++}$, having a mass number of 48.4 to 49.9), etc. Hence, it is believed that, because these trivalent tungsten fluoride ions have a mass number near to 49, i.e., the mass number of boron difluoride, they cannot be completely removed at the slit of the mass analyzer, and are thereby implanted into the silicon substrate (see, for example, "Contamination in ULSI Production" (Tsuneo Ajioka et al., July 1999, pp. 304–311)).

SUMMARY OF THE INVENTION

Figure 1A:
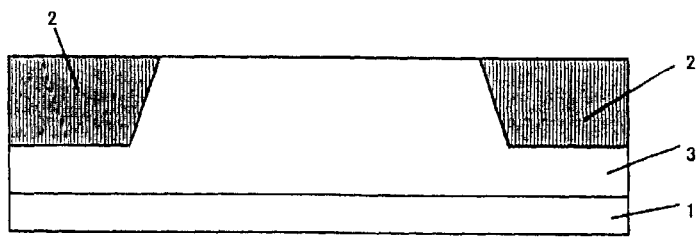
FIG. 1(a) to FIG. 1(e) are each a schematic cross section view of the process steps showing the key portions for explaining the method for producing a semiconductor device according to the present invention.

The present invention has been made in the light of the aforementioned problems. Hence, an object of the present invention is to provide a method for producing a semiconductor device, which, even in a semiconductor device having silicide films, is capable of implementing a semiconductor device of high reliability while preventing degradation from occurring on gate oxide films.

DESCRIPTION OF THE PREFERRED EMBODIMENTS

The method for producing a semiconductor device according to the present invention mainly comprises forming a gate electrode on a semiconductor substrate, forming source/drain regions by ion implantation using the gate electrode as a mask, and forming a silicide film on at least the surface of the gate electrode.

Concerning the semiconductor substrate for use in the present invention, there is no particular limitation so long as it is a semiconductor substrate commonly used in a semiconductor device, and specifically mentioned are those made of, for instance, an elemental semiconductor such as silicon, germanium, etc., or a compound semiconductor such as GaAs, InGaAs, ZnSe, etc. Particularly mentioned among them is a silicon substrate. Preferably, a device isolation region is formed on the semiconductor substrate, and there can be provided thereon an element such as a transistor, a capacitor, a resistor, etc., an interlayer insulating film, etc., or furthermore, a circuit, a semiconductor device, etc., made from such elements and films.

In the method for producing a semiconductor device according to the present invention, a gate electrode is first formed on the semiconductor substrate. Before the gate electrode is formed, a gate insulating film made of a silicon oxide film, a silicon nitride film, or a layered film thereof and the like is preferably formed on the semiconductor substrate, by means of, for instance, a thermal oxidation method, a CVD method, etc. Then, a single crystal silicon or polysilicon is formed on the entire surface of the semiconductor substrate by, for instance, a CVD method and the like, which is then patterned as desired to form the gate electrode. The patterning can be performed by a known method, for instance, by photolithography and etching.

Then, source/drain regions are formed by ion implantation by using the gate electrode as a mask. During the ion implantation, ions are also incorporated into the gate electrode.

The ion implantation above is performed using an ion implantation apparatus. Any type of ion implantation apparatus may be used in this step so long as it is an apparatus widely used in the field of producing a semiconductor device. For example, the ion implantation apparatus may comprise an ion source for generating ions or plasma, a drawing electrode for drawing out and/or accelerating the ions or plasma generated, a mass analyzer magnet for deflecting the ions or plasma and a slit for passing through the ions or plasma. In particular, preferred is such as comprises an ion source constituted of an arc chamber, a filament, etc., which are made of materials other than tungsten, and particularly preferred is such as comprises an ion source made of SiC, Si or alumina.

The ion implantation that is performed to form the source/drain regions may be for implanting N-type impurity ions such as phosphorus, arsenic, etc., or P-type impurity ions such as boron, $BF_2$, etc. The ion dose, accelerating energy, etc., for performing the ion implantation may be properly controlled depending on the kind of the ion and the performance, size, etc., of the semiconductor device to be produced.

In general, contaminants, such as metals, ascribed to the ion implantation apparatus and the like are incorporated into the source/drain regions and/or the gate electrode during the ion implantation. However, in the present invention, it is required that the tungsten dose is controlled to fall approximately in a range from 0 to $5 \times 10^9$ atom/cm$^2$. Otherwise, instead of controlling the tungsten dose, the tungsten concentration in the gate electrode after the ion implantation may be controlled to fall approximately in a range from 0 to $3 \times 10^{14}$ atom/cm$^3$. In general, the tungsten concentration of the gate electrode after the ion implantation can be controlled to the range above by controlling the tungsten dose in implanting the ions to the range defined above.

The tungsten dose in implanting the ions can be controlled to the aforementioned range, more specifically, for instance, by performing ion implantation using an ion implantation apparatus with an ion source composed of an arc chamber, a filament, etc., which are made of a material other than tungsten, or by controlling the arc current and/or the slit width and the like of the mass analyzer of the ion sources of the ion implantation apparatus.

The arc current and/or the slit width and the like of the mass analyzer can be properly controlled depending upon the impurity ion species used for forming the source/drain regions, the dose and the accelerating energy; for instance, the arc current can be controlled to a range of about 2,000 mA or lower, and the slit width of the mass analyzer may be set to about 15 mm or less. The ranges above are particularly effective in the case of using $BF_2^+$ to form the source/drain regions. However, if the arc current of the ion source of the ion implantation apparatus becomes lower than 10 mA, ion beam for performing ion implantation is no longer generated, and hence, desired ions cannot be implanted into the silicon substrate. Thus, the arc current of the ion source of the ion implantation apparatus is preferably set to about 10 mA or higher. If the slit width of the mass analyzer is set narrower than 0.01 mm, the ion beam for implanting the desired ions can no longer pass through the slit of the mass analyzer, and hence, the desired ions cannot be implanted into the silicon substrate. Thus, the slit width of the mass analyzer of the ion implantation apparatus is preferably set to about 0.01 mm or more.

Then, a silicide film is formed on at least the surface of the gate electrode. Because the gate electrode is formed by a single crystal silicon or polysilicon, the silicide film must be formed at least on the surface of the gate electrode, however, in the case where the source/drain regions are formed surface of the silicon substrate, a silicide film is formed on the source/drain regions at the same time the silicide film is formed on the gate electrode.

The silicide film can be formed by a known method, for instance, a so-called salicide technique, which comprises forming a film of a metal constituting the silicide film on the entire surface of the semiconductor substrate, applying heat treatment, and removing the metallic film left over the reaction. As the metallic film, there can be mentioned films of metals such as titanium, cobalt, tungsten, platinum, molybdenum, palladium, tantalum, etc., but preferred among them may be a titanium film. The metallic film can be formed by a known method, for instance, sputtering, vapor evaporation, EB method, etc. The film thickness of the metallic film can be properly adjusted depending on the metal species, the temperature of a post heat treatment, time, film thickness of the silicide film to be formed, etc.; for instance, the film thickness may be in a range from about 5 to 70 nm. The heat treatment may be performed under gaseous nitrogen, gaseous oxygen and/or an inert gas atmosphere, in the temperature range of about 650 to 700° C. for a time duration of about 10 to 60 minutes. Otherwise, rapid thermal annealing (RTA) may be performed at a similar temperature range for a duration of about 10 to 60 seconds. The metallic film left over the reaction may be removed, for instance, by means of wet etching using a mixed solution of sulfuric acid and hydrogen peroxide, a mixed solution of ammonia and hydrogen peroxide, etc. Further, a post heat treatment is preferably performed as described above in a temperature range of about 850 to 900° C. in the manner of the above.

In the method for producing a semiconductor device according to the present invention, an LDD region may optionally be formed by implantation ions before, during or after any production step. However, the dose or the concentration of tungsten at this ion implantation for the LDD region also needs to be controlled not to exceed the range mentioned above concerning the formation of the source/drain regions.

Furthermore, the various types of processes generally necessary for implementing the semiconductor device, such as the formation of insulating films, contacts, wirings, etc., may preferably be performed before, during or after any production step.

Hereinafter, the method for producing a semiconductor device according to an embodiment of the present invention will be described with reference to the drawings. However, the present invention is not limited thereto.

Referring to FIG. 1(a), boron ions are implanted into a silicon substrate 1 having a device isolation region 2 provided thereon, and heat treatment is applied to the resulting structure to form a N-well 3.

Figure 1B:
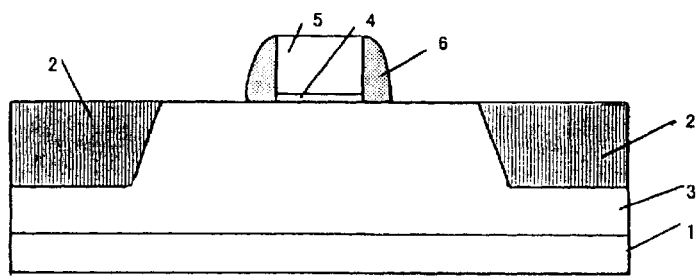

Then, as shown in FIG. 1(b), a silicon oxide film is formed by thermal oxidation, and a polysilicon film is formed by a CVD method. The silicon oxide film and the polysilicon film are patterned as desired by means of photolithography and etching process, thereby forming a gate oxide film 4 and a gate electrode 5. A side wall spacer 6 is formed thereafter on the side wall of the gate electrode 5.

Figure 1C:
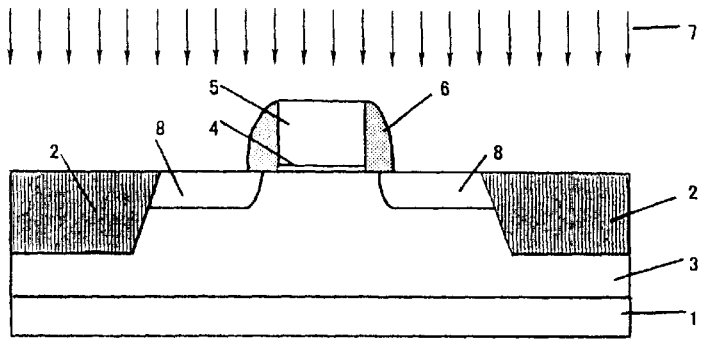

Referring to FIG. 1(c), boron difluoride ions 7 are implanted into the surface of the silicon substrate 1 by using the gate electrode 5 and the side wall spacer 6 as masks. At the same time, boron difluoride ions are implanted into the gate electrode 5.

Figure 2:
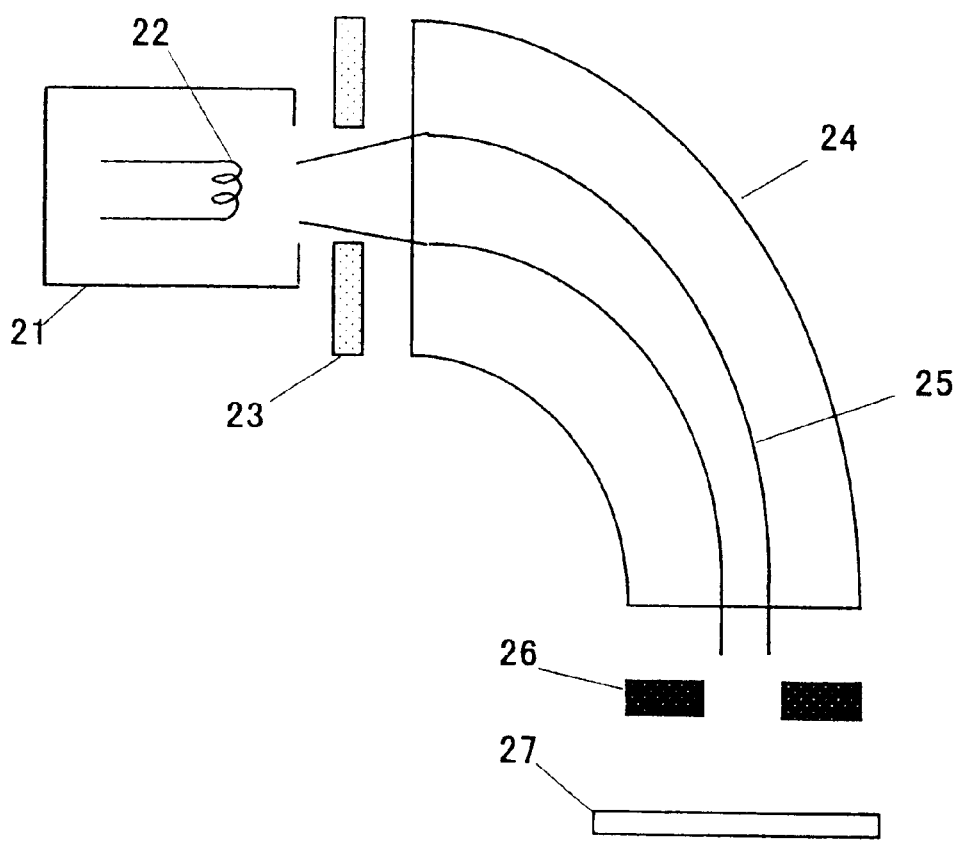
FIG. 2 is a schematic diagram for explaining the constitution of an ion implantation apparatus for use in the method for producing a semiconductor device according to the present invention.

The ion implantation is performed by using an ion implantation apparatus shown in FIG. 2, in a manner as follows. Firstly, for instance, a gaseous boron compound is introduced into an arc chamber 21, i.e., an ion source. Hot electrons are generated by heating a filament 22 inside the arc chamber by applying high electric current, and are allowed to collide with the gas thus introduced. Plasma is generated in this manner. Then, a negative voltage is applied to a drawing electrode 23 to draw out the positive ions alone from the plasma generated. The positive ions are accelerated by applying the desired accelerating energy. The positive ions thus accelerated are deflected by a mass analyzer magnet 24. In this manner, the desired positive ions, i.e., the ion beam 25 of $BF_2^+$ is allowed to pass through the slit 26 of the mass analyzer, and implanted into the silicon substrate 27.

The ion implantation in this case was performed by setting the dose of boron difluoride 7 to about $2 \times 10^{15}$ atom/cm$^2$, and at an acceleration energy of about 40 keV. The arc current and the slit width of the mass analyzer of the ion implantation apparatus was changed to various values in such a manner that the dose and the concentration of tungsten incorporated into the gate electrode 5 and the source/drain regions 8 should fall in a range of 0 to $8 \times 10^9$ atom/cm$^2$ and 0 to $5 \times 10^{14}$ atom/cm$^3$, respectively.

Then, the ions were activated by applying heat treatment to form the source/drain regions 8.

Subsequently, the naturally oxidized films formed on the upper plane of the gate electrode 5 and the source/drain regions 8 not covered with the side wall spacer 6 were removed by using hydrogen fluoride solution to expose silicon on the surface of the gate electrode 5 and the source/drain regions 8.

Figure 1D:
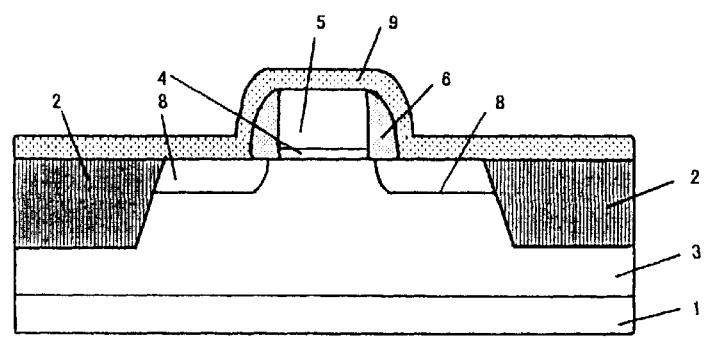

As shown in FIG. 1(d), a titanium film 9 was deposited to a thickness of about 35 nm on the entire surface of the silicon substrate 1 by means of sputtering. Then, as a first thermal treatment, RTA was performed in the temperature range from 650 to 700° C. for 30 seconds. In this manner, the titanium film 9 undergoes a silicide reaction with the exposed silicon only on the surface thereof as to form a titanium silicide film having a high resistance (with a specific resistivity falling in a range from 70 to 100 $\mu\Omega\cdot$cm).

Figure 1E:
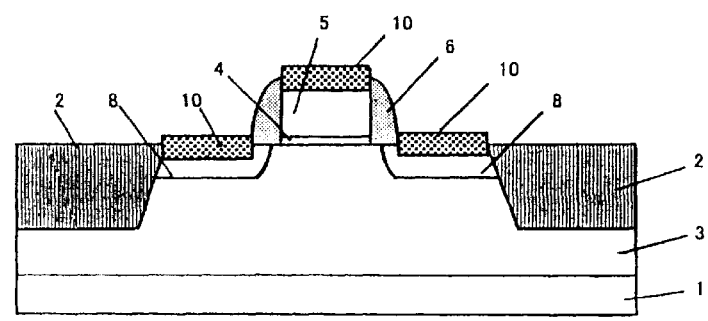

The titanium film 9 remaining unreacted with silicon was selectively removed by using a mixed solution of sulfuric acid and hydrogen peroxide to leave titanium silicide film 10 only on the surfaces of gate electrode 5 and the source/drain regions 8, as shown in FIG. 1(e). Furthermore, as a second heat treatment, RTA was performed for 10 seconds in the temperature range from about 850 to 900° C. to convert the high resistance silicide film 10 into a titanium silicide film having a lower resistance (with a specific resistivity falling in a range from about 13 to 20 $\mu\Omega\cdot$cm).

On the MOS transistor having the titanium silicide film thus formed, measurement was made on the amount of charge corresponding to a breakdown charge Qbd of 50% (denoted hereinafter as "50% Qbd"), which is generally employed as a value for evaluating the film quality of the gate oxide film. The dose and the concentration of tungsten incorporated in the gate electrode were measured with changing arc current and the slit width of the mass analyzer of the ion implantation apparatus. The results are given in FIG. 3 to FIG. 5, respectively. The measured area of the gate oxide film of the MOS transistor was found to be $4.79 \times 10^{-7}$ cm$^2$. The ion implantation apparatus used here was equipped with a tungsten arc chamber. In obtaining the results shown in FIG. 4, the slit width of the mass analyzer was set to 25 mm, and for the results shown in FIG. 5, the arc current was set to 3,500 mA.

Figure 3A:
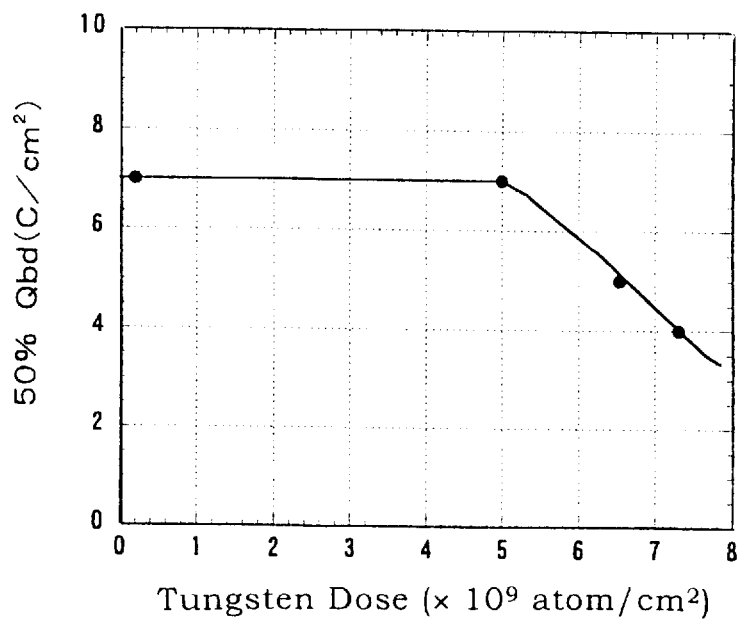
FIG. 3(a) and FIG. 3(b) are each a graph showing the relation between the quantity of charge which yields a breakdown charge Qbd of 50% (50%Qbd) and the dose and concentration of tungsten.

FIG. 3(a) reads that the 50% Qbd value decreases from 7 C/cm$^2$ with increasing the tungsten dose from $5 \times 10^9$ atom/cm$^2$. This implies that the reliability of the gate oxide film after forming the silicide film decreases as the tungsten dose becomes larger than $5 \times 10^9$ atom/cm$^2$. Thus, to maintain high reliability of the gate oxide film, it was found that the tungsten dose should be kept in a range of 0 to $5 \times 10^9$ atom/cm$^2$.

Figure 3B:
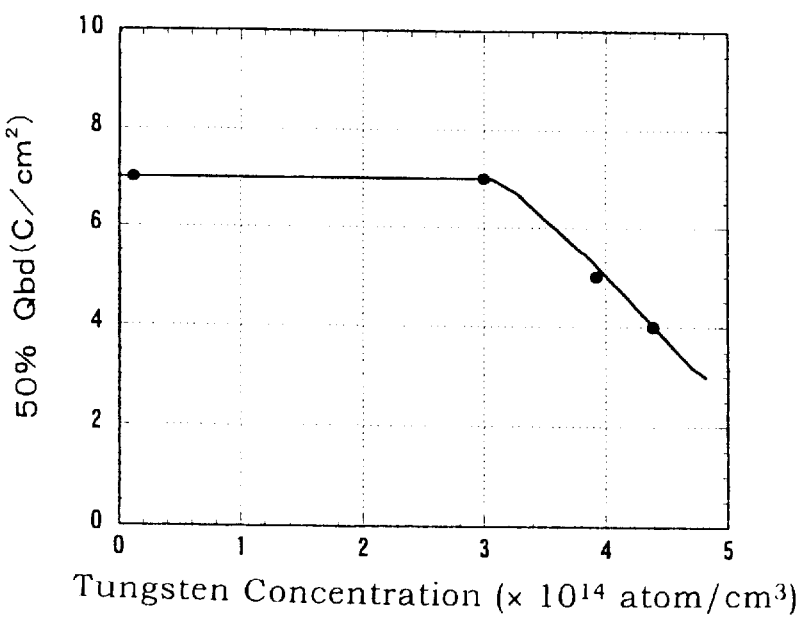

FIG. 3(b) reads that the 50% Qbd value decreases from 7 C/cm$^2$ with increasing the tungsten concentration of the gate electrode from $3 \times 10^{14}$ atom/cm$^3$. This shows that the reliability of the gate oxide film after forming the silicide film decreases as the tungsten concentration for the gate electrode becomes larger than $3 \times 10^{14}$ atom/cm$^3$. Thus, to maintain high reliability of the gate oxide film, it was found that the tungsten concentration should be kept in a range of 0 to $3 \times 10^{14}$ atom/cm$^3$.

Figure 4A:
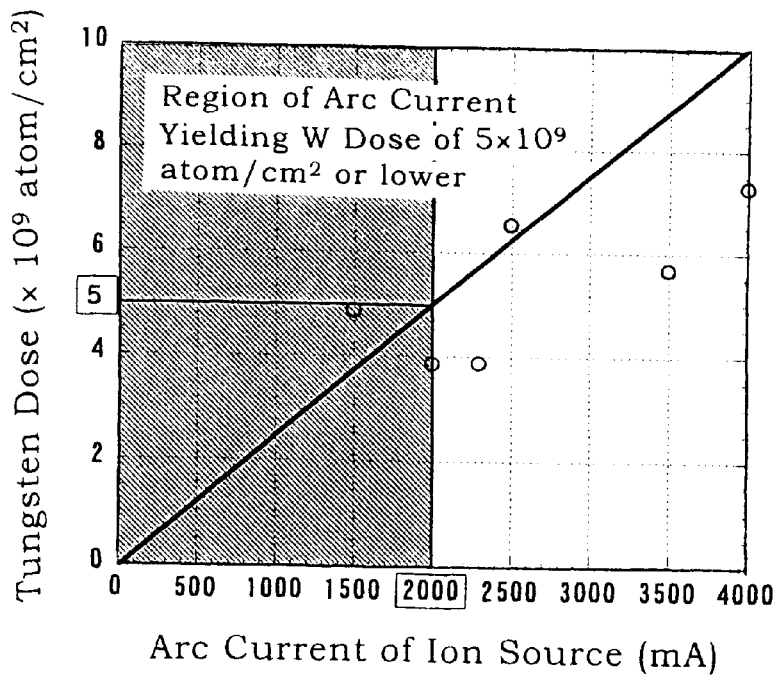
FIG. 4(a) and FIG. 4(b) are each a graph showing the relation between the arc current of the ion implantation apparatus and the dose and concentration of tungsten.
Figure 4B:
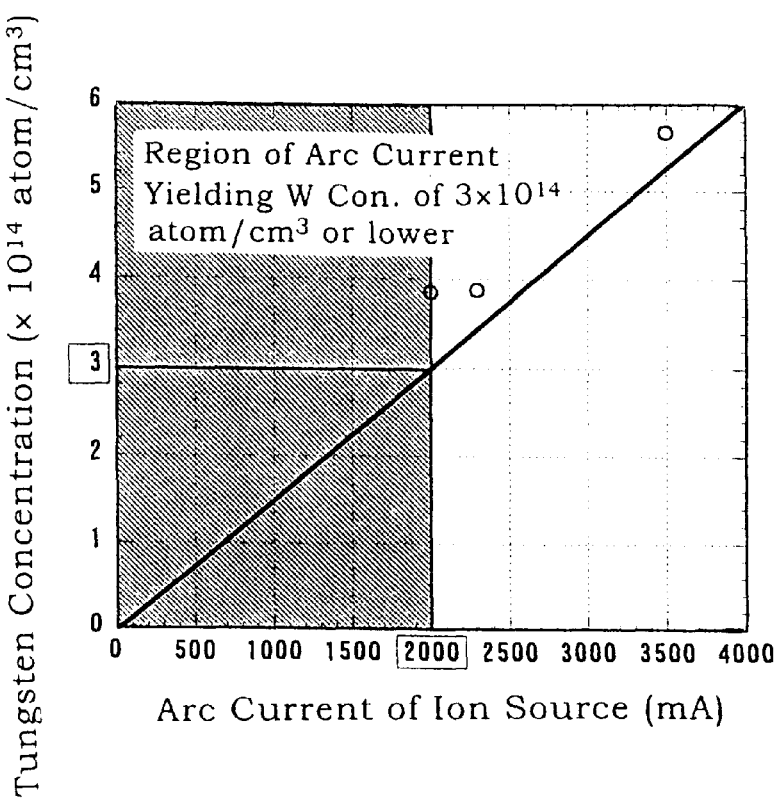

Further referring to FIG. 4(a) and FIG. 4(b), it can be understood that the dose and the concentration of tungsten both increase proportional to the arc current of the ion source of the ion implantation apparatus in a range from 0 mA to 4,000 mA. Thus, to prevent the deterioration in reliability of the gate oxide film from occurring by setting the tungsten dose to a value of $5 \times 10^9$ atom/cm$^2$ or lower, or by setting the tungsten concentration to $3 \times 10^{14}$ atom/cm$^3$ or lower, it was found necessary to maintain the arc current of the ion source to a value of 2,000 mA or lower.

Figure 5A:
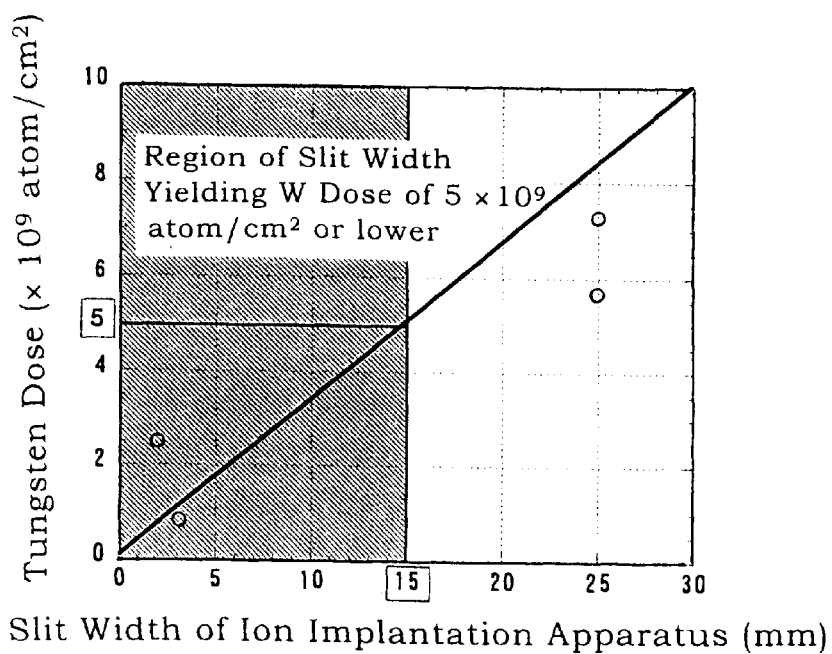
FIG. 5(a) and FIG. 5(b) are each a graph showing the relation between the slit width of the mass analyzer of the ion implantation apparatus and the dose and concentration of tungsten.
Figure 5B:
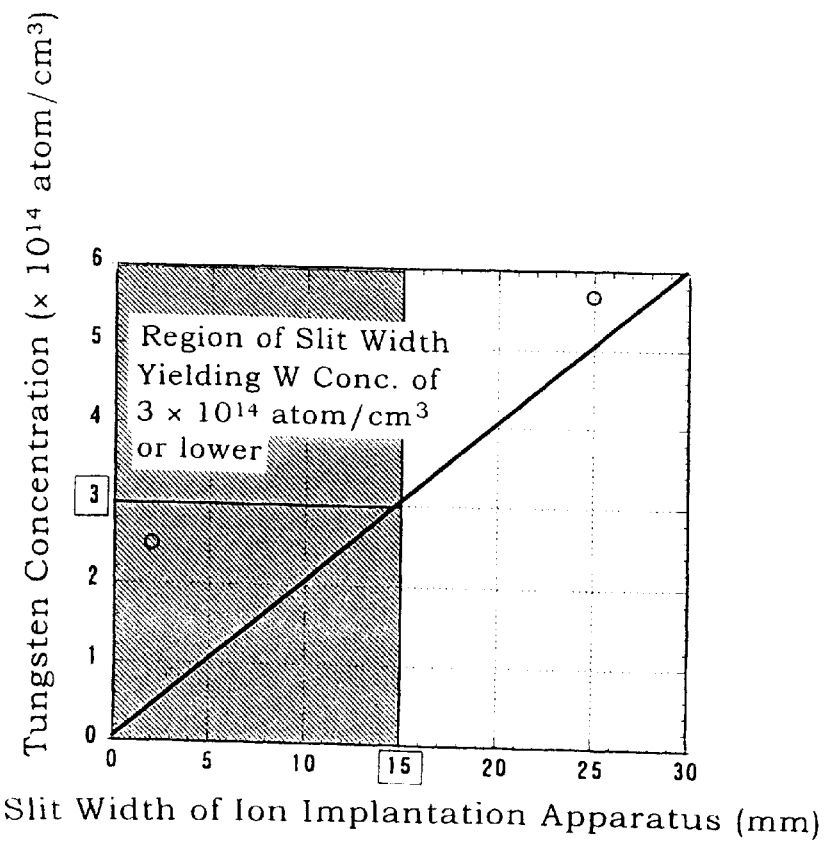

Referring to FIG. 5(a) and FIG. 5(b), it can be understood that the dose and the concentration of tungsten both increase proportional to the slit width of the mass analyzer of the ion implantation apparatus on changing the slit width in a range from 0 to 30 mm. Thus, to prevent the deterioration in reliability of the gate oxide film from occurring by setting the tungsten dose to a value of $5\times10^9$ atom/cm$^2$ or lower, or by setting the tungsten concentration to $3\times10^{14}$ atom/cm$^3$ or lower, it was found necessary to maintain the slit width of the mass analyzer to a value of 15 mm or smaller.

Figure 6A:
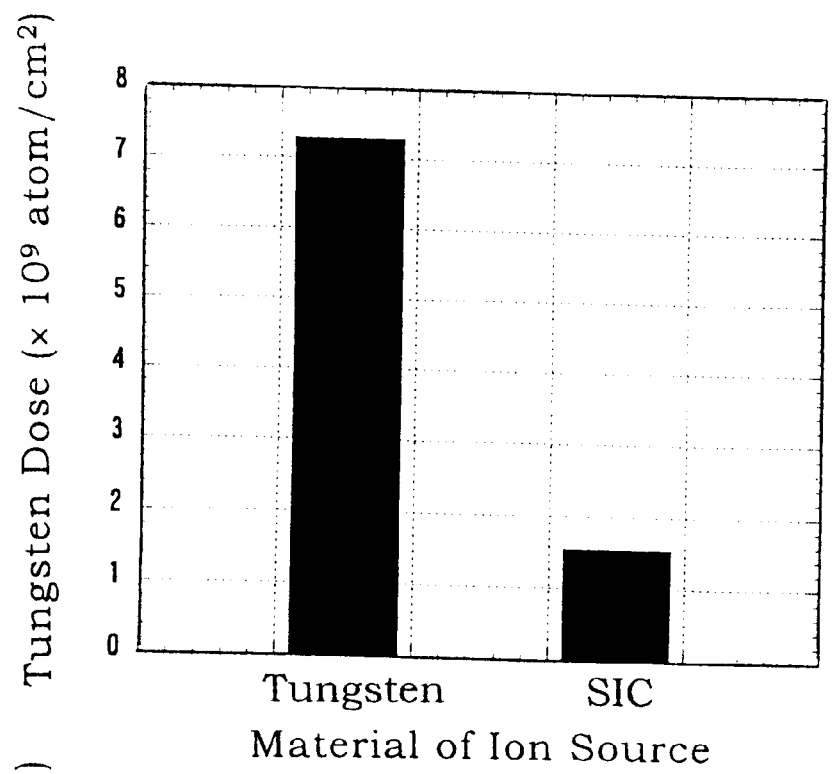
FIG. 6(a) and FIG. 6(b) are each a graph showing the relationship of the material of the arc chamber, i.e., the ion source, of the ion implantation apparatus to the dose and concentration of tungsten.
Figure 6B:
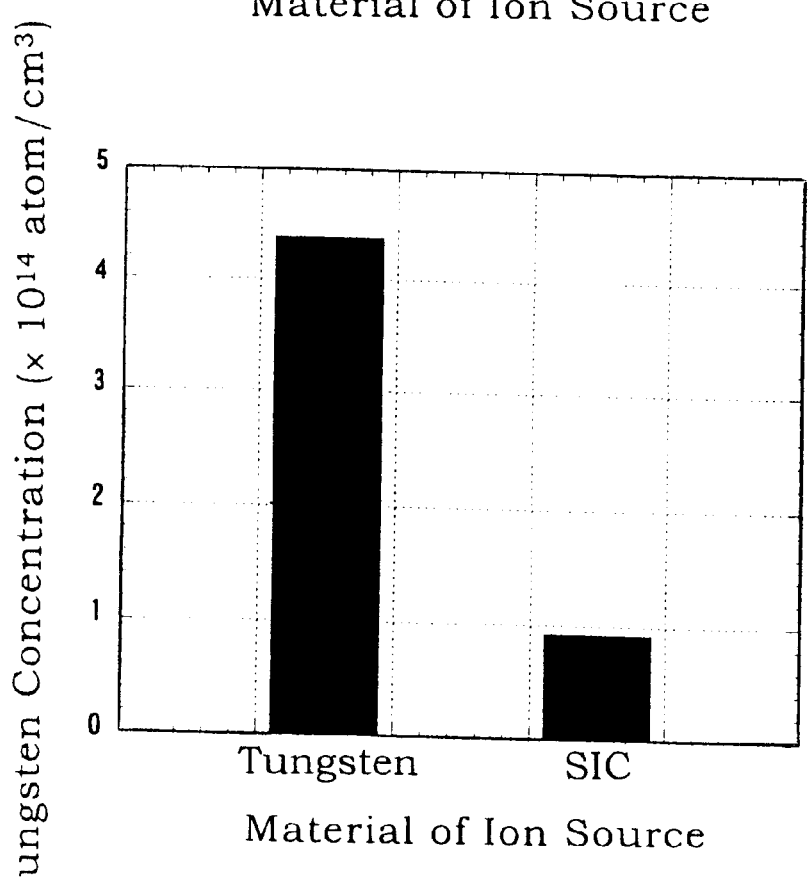
Figure 7A:
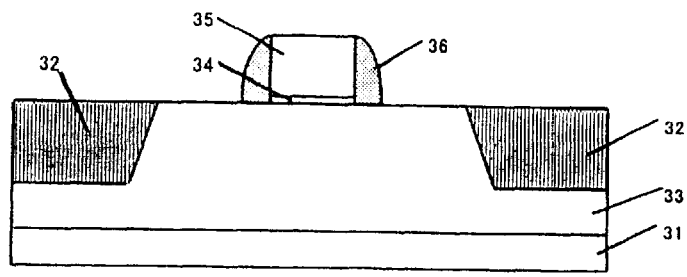
FIG. 7(a) to FIG. 7(e) are each a schematic cross section view of the process steps showing the key portions for explaining a prior art method for producing a semiconductor device.
Figure 7B:
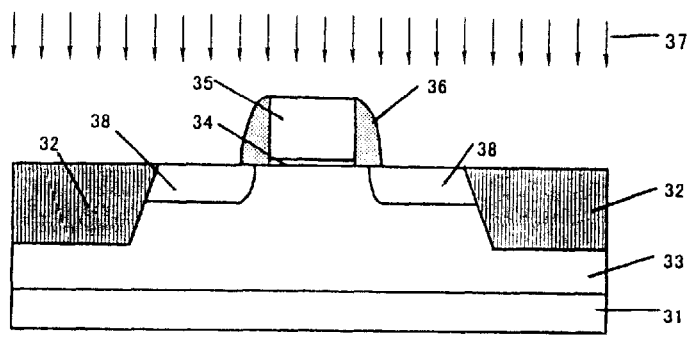
Figure 7C:
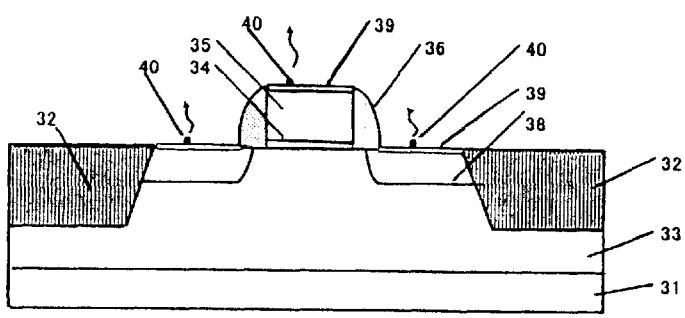
Figure 7D:
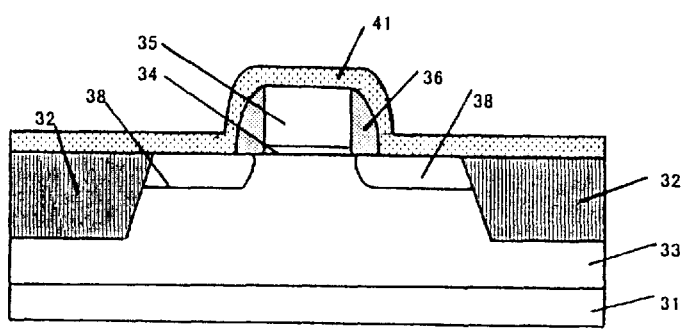
Figure 7E:
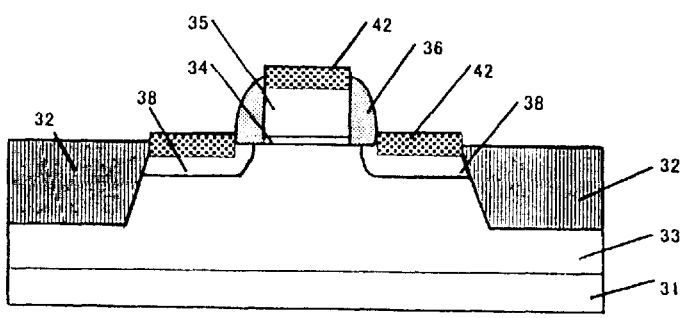

Furthermore, the material for constituting the arc chamber of the ion source of the ion implantation apparatus was changed from tungsten to SiC, and the dose as well as the concentration of tungsten implanted to the silicon substrate were compared. The results are shown in FIG. 6(a) and FIG. 6(b). In the measurements, the arc current and the slit width of the mass analyzer of the ion implantation apparatus were set to 4,000 mA and 25 mm, respectively.

Referring to FIG. 6(a) and FIG. 6(b), it can be understood that the tungsten dose of $5\times10^9$ atom/cm$^2$ or lower, or the tungsten concentration of $3\times10^{14}$ atom/cm$^3$ or lower, which are essential for preventing the drop in reliability of the gate oxide film from occurring, can be achieved by using SiC as the material constituting the arc chamber of the ion source of the ion implantation apparatus.

According to the present invention, a semiconductor device of high reliability is implemented by an ion implantation while controlling the tungsten dose to fall in a range of 0 to $5\times10^9$ atom/cm$^2$, or by controlling the tungsten concentration of the gate electrode subjected to ion implantation to fall in a range from 0 to $3\times10^{14}$ atom/cm$^3$. In this manner, the deterioration of the gate dielectric can be prevented from occurring.

In the case where a titanium silicide film is provided as the silicide film, in particular, a semiconductor device of high reliability can be surely produced.

Furthermore, by performing ion implantation while controlling the arc current of the ion source in a range from 10 to 2,000 mA, or while controlling the slit width of the mass analyzer of the ion implantation apparatus to a range from 0.01 to 15 mm, and/or by performing the ion implantation employing an apparatus equipped with an arc chamber made from SiC, Si or alumina as the ion source, the tungsten dose or concentration can be surely controlled to the range specified above. In this manner, a semiconductor device of high reliability can be surely implemented.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for producing a semiconductor device, the method comprising:

forming a gate electrode on a semiconductor substrate, using an ion implantation apparatus in forming source/drain regions by ion implantation using the gate electrode as a mask, the ion implantation apparatus comprising at least one of: a) an arc chamber including tungsten, and b) a filament including tungsten; and forming a suicide film on at least the surface of the gate electrode, wherein the ion implantation is performed by controlling tungsten concentration in the gate electrode ion implanted to fall in a range from 0 to $3\times10^{14}$ atom/cm$^3$.

2. A method as claimed in claim 1, wherein the suicide film is a titanium silicide film.

3. A method as claimed in claim 1, wherein the ion implantation is performed by using an ion implantation apparatus which comprises an ion source having an arc chamber and a filament for generating ions or plasma, a drawing electrode for drawing out and/or accelerating the ions or plasma generated, a mass analyzer magnet for deflecting the ions or plasma and a slit for passing through the ions or plasma, and by controlling an arc current of the ion a range from 10 to 2,000 mA.

4. A method as claimed in claim 1, the ion implantation is performed by using an ion implantation apparatus which comprises an ion source having an arc chamber and a filament for generating ions or plasma, a drawing electrode for drawing out and/or accelerating the ions or plasma generated, a mass analyzer magnet for deflecting the ions or plasma and a slit for passing through the ions or and by controlling the slit width in a range from 0.01 to 15 mm.

5. A method as claimed claim 1, wherein the ion implantation is performed by using an ion implantation apparatus equipped with as an ion source including an arc chamber made of SiC, Si or alumina.

6. A method for producing a semiconductor device, the method comprising:

forming a gate electrode on a semiconductor substrate, forming source/drain regions by an ion implantation using the gate electrode as a mask, wherein the ion implantation is performed using an ion implantation apparatus comprising at least one of: a) an arc chamber including tungsten, and b) a filament including tungsten; and forming a suicide film on at least the surface of the gate electrode, wherein the ion implantation is performed by controlling tungsten dose to fall in a range from 0 to $5\times10^9$ atom/cm$^2$.

* * * * *